(12) United States Patent
Kim et al.

(10) Patent No.: US 7,566,642 B2
(45) Date of Patent: Jul. 28, 2009

(54) PROCESS OF MANUFACTURING AN N-TYPE SCHOTTKY BARRIER TUNNEL TRANSISTOR

(75) Inventors: Yark Yeon Kim, Daejeon (KR); Moon Gyu Jang, Daejeon (KR); Jae Heon Shin, Daejeon (KR); Seong Jae Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 521 days.

(21) Appl. No.: 11/188,076

(22) Filed: Jul. 22, 2005

(65) Prior Publication Data

US 2006/0131664 A1    Jun. 22, 2006

(30) Foreign Application Priority Data

Dec. 21, 2004    (KR) .................... 10-2004-0109298

(51) Int. Cl.
*H01L 21/44* (2006.01)
(52) U.S. Cl. .................. 438/581; 438/582; 438/164
(58) Field of Classification Search ......... 438/142–399, 438/400–600
See application file for complete search history.

(56) References Cited

U.S. PATENT DOCUMENTS 6,339,005 B1    1/2002    Bryant et al.
6,974,737 B2 *  12/2005   Snyder et al. ............... 438/199
2002/0022366 A1  2/2002  Cabral, Jr. et al.

FOREIGN PATENT DOCUMENTS

| JP | 5-315286 | 11/1993 |
|---|---|---|
| JP | 2002-305029 | 10/2002 |
| JP | 2004-140262 | 5/2004 |
| KR | 10-19980042717 | 10/1998 |

OTHER PUBLICATIONS

L.E. Calvet, C. Wang, J.P. Snyder, J.R. Tucker, Suppression of leakage current in Schottky barrier metal-oxide-semiconductor field-effect transistors, *Journal of Applied Physics*, vol. 91, No. 2, Jan. 15, 2002.

* cited by examiner

*Primary Examiner*—Lynne A. Gurley
*Assistant Examiner*—Samuel A Gebremariam
(74) *Attorney, Agent, or Firm*—Blakely, Sokoloff, Taylor & Zafman LLP

(57) ABSTRACT

An n-type SBTT and a manufacturing method thereof are provided. The SBTT includes a silicon layer, a gate, a double layer that has a rare-earth metal silicide layer and a transition metal silicide layer. The silicon layer has a channel region. The gate is formed in an overlapping manner on the channel region and has a gate dielectric layer on its interface with respect to the silicon layer. The double layer is formed as a source/drain that has the channel region interposed on the silicon layer.

4 Claims, 5 Drawing Sheets

PROCESS OF MANUFACTURING AN N-TYPE SCHOTTKY BARRIER TUNNEL TRANSISTOR

CROSS-REFERENCE TO RELATED PATENT APPLICATION

This application claims the benefit of Korean Patent Application No. 10-2004-0109298, filed on Dec. 21, 2004, in the Korean Intellectual Property Office, the disclosure of which is incorporated herein in its entirety by reference.

BACKGROUND OF THE INVENTION

1. Field of the Invention

The present invention relates to a semiconductor device, and more particularly, to an n-type Schottky barrier tunnel transistor (SBTT) and a manufacturing method thereof.

2. Description of the Related Art

As a semiconductor device is microminiaturized in its size, a leakage current due to a short channel effect is remarkably increased and an operation characteristic of the semiconductor device is deteriorated. To overcome these problems, lots of researches are under progress. For one of examples, an SBTT may be suggested.

The SBTT may be recognized as a device having a possibility of solving a problem caused by a shallow junction between a source/drain electrode and a channel which is a crucial technical factor for suppressing the short channel effect as a metal oxide semiconductor field effect transistor (MOSFET) is currently scaled down, and additionally solving a problem caused by a gate oxide layer.

In the n-type SBTT, rare-earth metal silicide formed by having rare-earth metal react to silicon (Si) may be used for the source and the drain electrodes. The rare-earth metal silicide has a small work function and thus has a considerably small Schottky barrier with respect to the silicon. Therefore, the rare-earth metal silicide may be considered as having a large saturated current compared with transition metal silicide. Nevertheless, the rare-earth metal silicide may show a very weak thermal stability but shows a large electric specific resistance and thus is examined as having a small saturated current substantially.

Studies on forming a source and a drain of the n-type SBTT of a related art have been primarily concentrated on forming a rare-earth metal silicide of a single layer by performing a thermal treatment after depositing rare-earth metal having a small work function on a silicon substrate. Nevertheless, when forming the source and the drain with the rare-earth metal silicide of the single layer, an electric resistance is relatively large, whereby a larger saturated current cannot be obtained. Therefore, to overcome this disadvantage, it is very important to reduce a parasitic resistance that might be unnecessarily generated due to a large electric specific resistance without destroying a small Schottky barrier between the source and the drain formed with the rare-earth metal silicide.

SUMMARY OF THE INVENTION

The present invention provides an n-type SBTT of a source/drain structure and a manufacturing method thereof capable of reducing a parasitic resistance while introducing rare-earth metal silicide so as to form lower Schottky barrier.

The present invention also provides an n-type SBTT, which includes: a silicon layer for a channel region; a gate formed in an overlapping manner on the channel region on the silicon layer and having a dielectric layer interposed on an interface of the silicon layer; rare-earth metal silicide layers formed as a source/drain that has the channel region interposed on the silicon layer; and transition metal silicide layers formed on the rare-earth metal silicide layer, for constituting the source/drain together with the rare-earth metal silicide layers.

The rare-earth metal silicide layer can be extended toward a channel region side so that part of the rare-earth metal silicide layer is overlapped under the gate.

The silicon layer can be so configured that a surface of a silicon layer portion in the channel region has a relatively high step than that of a silicon layer portion under the rare-earth metal silicide layer.

According to an aspect of the present invention, there is provided a method for manufacturing an n-type SBTT, which includes: introducing a silicon layer for a channel region; forming, on the silicon layer, a gate overlapped on the channel region and having a dielectric layer interposed on an interface of the silicon layer; forming a rare-earth metal silicide layer on the silicon layer in a neighborhood of the gate; and forming a transition metal silicide layer on the rare-earth metal silicide layer to form a source/drain that includes the rare-earth metal silicide layer and the transition metal silicide layer.

At this point, the forming of the rare-earth metal silicide layer comprises: forming a rare-earth metal layer on the silicon layer; and thermally treating the rare-earth metal layer so that the rare-earth metal layer reacts to the silicon to form the rare-earth metal silicide layer, and continuing the thermal treatment so that the silicon is diffused out and precipitated on a surface of the rare-earth metal silicide layer to form a silicon-precipitated layer.

Further, the forming the transition metal silicide layer comprises: forming a transition metal layer on the silicon-precipitated layer; and thermally treating the transition metal layer under a temperature lower than a temperature of the thermal treatment for the rare-earth metal silicide layer so that the transition metal layer reacts to the silicon-precipitated layer to form the transition metal silicide layer.

According to another aspect of the present invention, there is provided a method for manufacturing an n-type SBTT, which includes: introducing a silicon layer for a channel region; forming, on the silicon layer, gates overlapped on the channel region and having a dielectric layer interposed on an interface of the silicon layer; forming a rare-earth metal layer on the silicon layer in a neighborhood of the gates; forming a transition metal layer on the rare-earth metal layer; and thermally treating the rare-earth metal layer and the transition metal layer to form a source/drain that includes a double layer having a rare-earth metal silicide layer and a transition metal silicide layer.

Here, the rare-earth metal silicide layer can include a silicide of rare-earth metal such as Sm, Eu, Gd, Tb, Dy, Ho, Er, Tm, Yb, and Lu.

The transition metal silicide layer can include a silicide of transition metal such as Ni, Ti, Co, Fe, and Mo.

The silicon layer can be a silicon layer on an upper side of SOI (silicon-on-insulator) substrate.

Further, an operation of forming a spacer on a sidewall of the gate before forming the rare-earth metal silicide layer can be further provided. An operation of having a step generated on the silicon layer portion where the source/drain is to be formed in a neighborhood of the spacer by performing a spacer etching for forming the spacer together with an overetching can be further provided.

According to the present invention, it is possible to improve a saturated current by forming the transition metal silicide having very excellent electrical conductivity on the rare-earth metal silicide in order to reduce a parasitic resistance of the rare-earth metal silicide that forms a small Schottky barrier but has a large electric resistance.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
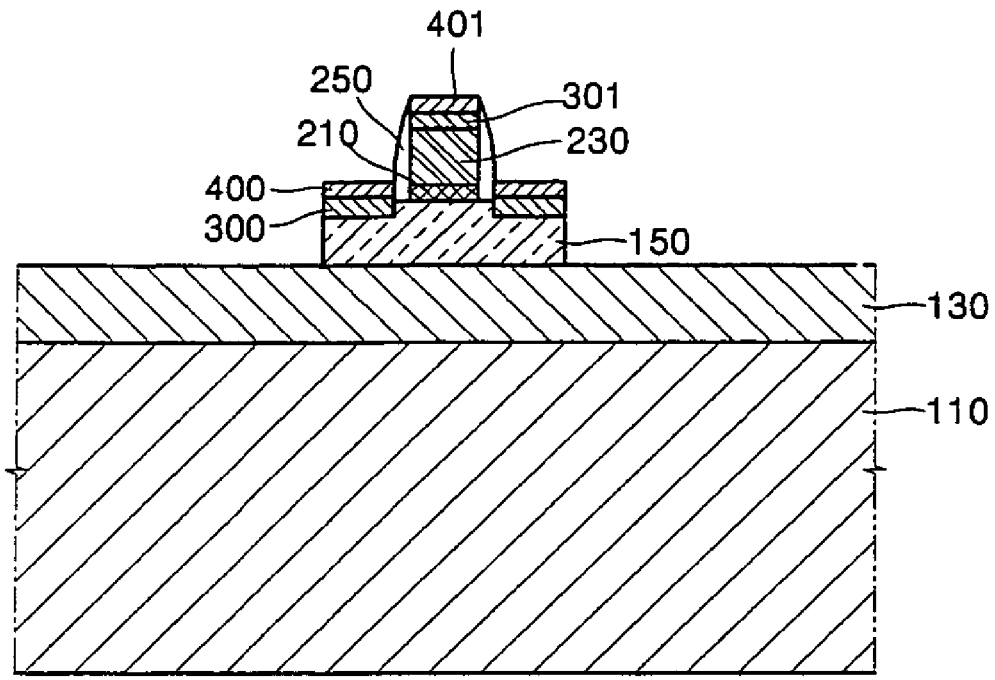
FIG. 1 is a cross-sectional view schematically illustrating an n-type SBTT according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity.

The embodiment of the present invention suggests a method for forming a silicide of a two-story structure without an undesired increase of the Schottky barrier capable of improving an operation characteristic of the SBTT by reducing a parasitic resistance of a source and a drain in an n-type SBTT manufactured by replacing the source and the drain with rare-earth metal silicide. Introduction of the rare-earth metal silicide for the source and the drain of the n-type SBTT can cause a considerably small Schottky barrier compared with the silicon due to a small work function of the rare-earth metal silicide. Therefore, the rare-earth metal silicide comes to have a large saturated current compared with the silicide of the transition metal. On the contrary, the rare-earth metal silicide is vulnerable to heat and has a large specific resistance. To overcome these disadvantages, it should be crucially considered to effectively reduce the parasitic resistance without the increase of the small Schottky barrier of the source and the drain formed by the rare-earth metal silicide.

To solve the problems in the source/drain structure that has introduced the rare-earth metal silicide, introduction of an oxidation prevention layer of the rare-earth metal silicide or a metal electrode having a small electric resistance can be considered. The present invention solves the problems of the single structure in the rare-earth metal silicide using the source/drain formed in a two-story layered silicide structure. That is, the present invention suggests a structure such that a silicide layer that contacts a silicon channel is formed with the rare-earth metal silicide and the a surface that corresponds to an external electrode is formed with the transition metal silicide having an excellent electrical conductivity. Accordingly, the device according to the present invention can reduce thermal vulnerability of the rare-earth metal silicide and the parasitic resistance accompanied by the source/drain.

Further, the introduction of the two-story layered silicide structure has an advantage of substantially preventing an increase of a Schottky barrier height due to destruction of the interface between the silicon channel and the rare-earth metal silicide. That is, when the transition metal silicide directly contacts the silicon channel, the Schottky barrier height is increased and the saturated current can be rather reduced. Therefore, in the embodiment of the present invention, when a two-story film structure silicide is formed, a boundary between the rare-earth metal silicide and the transition metal silicide is definitely formed.

The above-described two-story layered silicide structure can be formed by the following two methods. First, a method of increasing a temperature of a thermal treatment after sequentially depositing the rare-earth metal and the transition metal on the silicon of the source/drain region can be considered. If this method is performed, the silicon acts as a diffuser in case of the rare-earth metal silicide and thus the silicon is diffused toward the rare-earth metal layer so that the rare-earth metal silicide is formed and subsequently the silicon is diffused toward the transition metal layer. Resultantly, the transition metal silicide is formed by the diffusion of the transition metal and the silicon on the surface. This method goes through a considerably sensitive process with respect to temperature and time.

According to another method, the rare-earth metal is deposited on the silicon region first and the deposited rare-earth metal is thermally processed so that the rare-earth metal silicide is formed. At this point, the silicon forms the rare-earth metal silicide depending on thermal treatment conditions and is diffused into and precipitated on the surface. After the transition metal is deposited on the precipitated silicon layer, the deposited transition metal is thermally treated under a temperature lower than the case of the rare-earth metal silicide, so that the transition metal silicide is formed. By processing as described above, it is possible to reduce the parasitic resistance of the source/drain and thus increase the saturated current without a substantial increase of the Schottky barrier height. At this point, a reaction temperature of the transition metal silicide should be lower than the temperature for use in forming the rare-earth metal silicide. Ni can be considered for a representative example of such transition metal.

FIG. 1 is a cross-sectional view schematically illustrating an n-type SBTT according to an embodiment of the present invention. FIGS. 2 through 5 are cross-sectional views schematically illustrating an example of a method for manufacturing an n-type SBTT according to an embodiment of the present invention.

Figure 2:
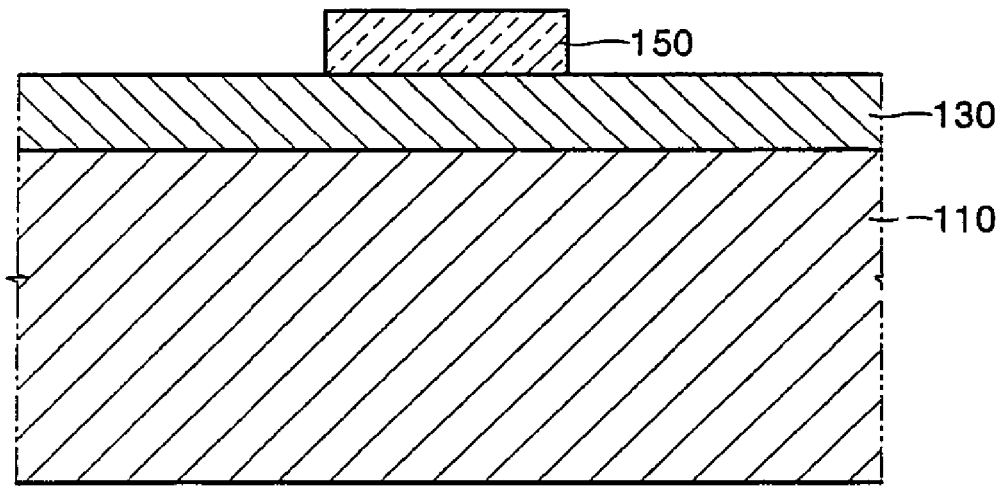
FIGS. 2 through 5 are cross-sectional views schematically illustrating an example of a method for manufacturing an n-type SBTT according to an embodiment of the present invention.

Referring to FIG. 2 with consideration of the structure illustrated in FIG. 1, the SBTT according to the embodiment of the present invention is formed on a semiconductor substrate, e.g., a P-type SOI (silicon-on-insulator) substrate. The SOI substrate includes a silicon substrate layer 110 for mechanical support, an insulation layer 130 of a buried-insulation-oxidation layer, and an active silicon layer 150 on the insulation layer 130. The silicon layer 150 is patterned using a dry etching so that the active silicon layer 150 in which a source/drain is to be formed is formed.

At this point, if the device is manufactured with a thickness of the silicon layer 150 on the SOI substrate made thin, a thickness of the channel region controlled by a gate is reduced and thus formation of an inversion layer can be controlled in a very easier manner. Resultantly, a leakage current between a source and a drain of a transistor can be reduced.

Figure 3:
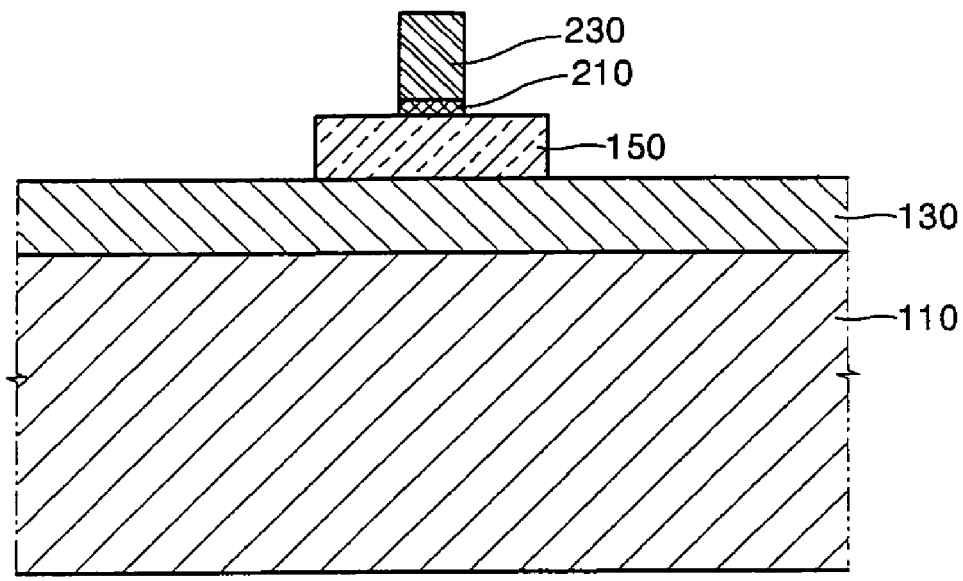

Referring to FIG. 3, a gate dielectric layer 210 is formed on the silicon layer 150, a layer for a gate 230 is formed on the gate dielectric layer 210, and patterning is performed so that the gate 230 is formed. At this point, the gate dielectric layer 210 can include an insulation layer such as a silicon oxide layer, an aluminum oxide layer, and hafnium oxide layer. The gate 230 can be formed as including a conductive polysilicon layer. The pattering of the gate 230 can be performed by forming a mask using a photoetching process that uses a photoresist and performing a selective-dry etching that uses a mask.

Figure 4:
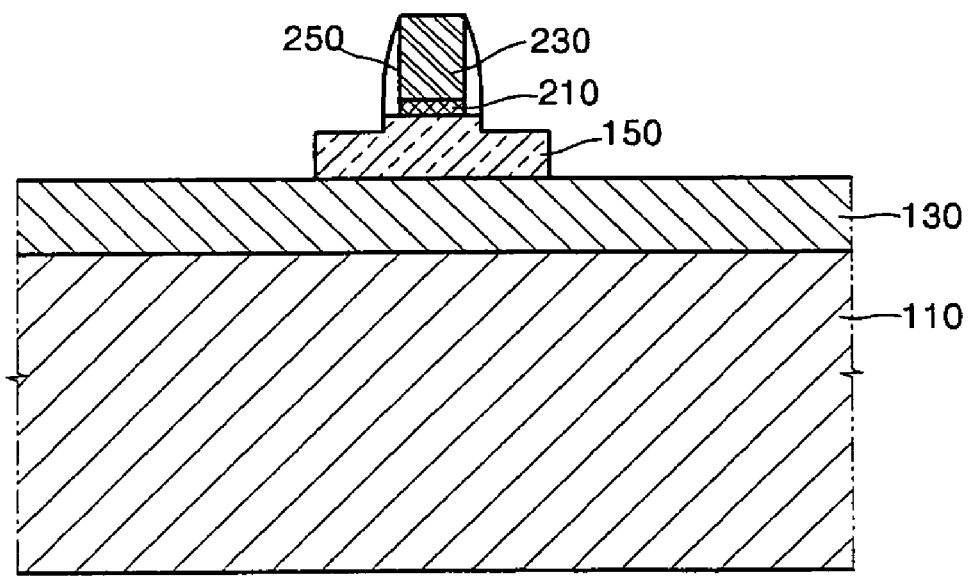

Referring to FIG. 4, for forming a spacer 250 between the source, the drain, and the gate 230, a silicon oxide layer is thermally formed and the silicon oxide layer is spacer-etched using a dry-etching.

Since the SBTT provides much flexibility in the thermal treatment temperature unlike field effect transistors (FETs) that form a source and a drain by diffusing impurities into the substrate, a very simple thermal treatment process can be utilized so as to form a gate spacer. Further, regions in which a source, a drain, and a gate electrodes are to be formed are prepared by removing an oxide layer portion except the gate spacer 250 using a dry-etching. At this point, for improving a saturated current, an over-etching may be performed on the regions in which the source and the drain are to be formed as illustrated in FIG. 4 so that an overlap between the silicide, that will be formed later, and the gate 230 may be improved.

Figure 5:
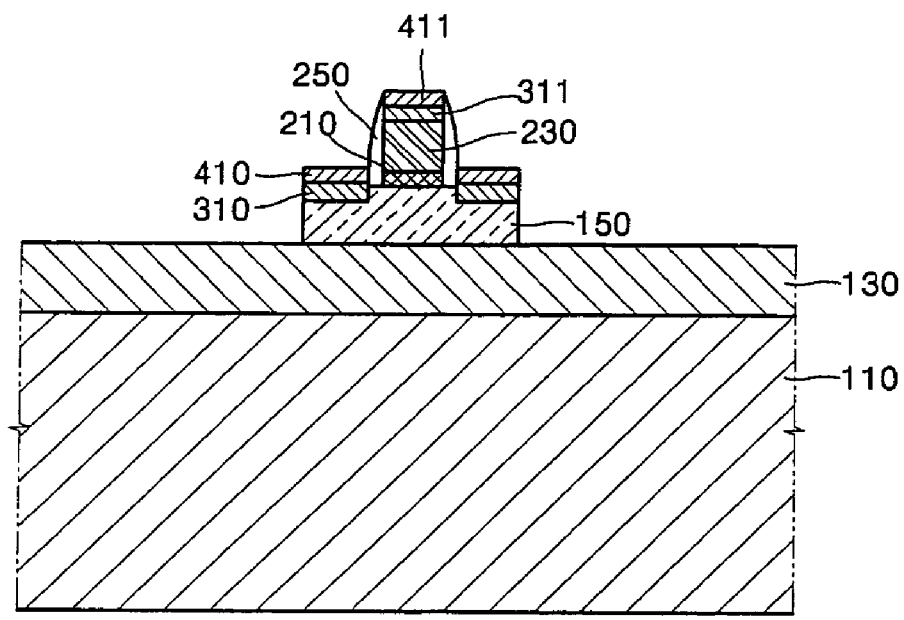

Referring to FIG. 5, the rare-earth metal layer and the transition metal layer are sequentially deposited on the source and the drain using the first method for forming the silicide of the two-story layered structure. At this point, the rare-earth metal layer can be formed using metal such as Sm, Eu, Gd, Tb, Dy, Ho, Er, Tm, Yb, and Lu. For the transition metal, metal such as Ni, Ti, Co, Fe, and Mo can be used.

After that, the thermal treatment is performed using a furnace for a rapid thermal annealing or a general furnace and metal layer portions that are not converted into the silicide are selectively removed so that the silicide 310 and 410 of the two-story structure is formed. The silicide of the two-story structure is formed in form of a stacked structure in which the rare-earth metal silicide layer 310 by the rare-earth metal layer and the transition metal silicide layer 410 by the transition metal layer are stacked. By formation of the silicide 310 and 410 of the two-story structure, the source/drain is formed.

At this point, the rare-earth metal silicide layer can include silicide of rare-earth metal such as Sm, Eu, Gd, Tb, Dy, Ho, Er, Tm, Yb, and Lu, and the transition metal silicide layer can include silicide of transition metal such as Ni, Ti, Co, Fe, and Mo.

In the meantime, a rare-earth metal silicide layer 311 and a transition metal silicide layer 411 can remain on the gate 230 exposed during the silicide forming process.

FIGS. 6 through 9 are cross-sectional views schematically illustrating another example of a method for manufacturing an n-type SBTT according to an embodiment of the present invention.

Figure 6:
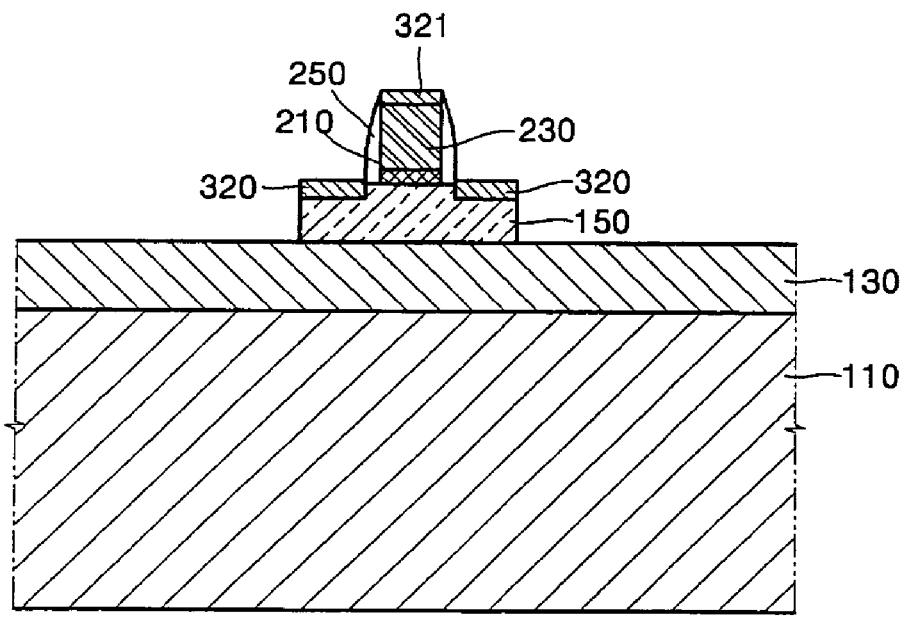
FIGS. 6 through 9 are cross-sectional views schematically illustrating another example of a method for manufacturing an n-type SBTT according to an embodiment of the present invention.

Referring to FIG. 6 with consideration of FIG. 1, after the gate 230 and the gate spacer 250 are formed as described with reference to FIGS. 2 through 4, the rare-earth metal layer is deposited on the source and the drain. After that, the rare-earth metal silicide layer 320 is formed by heating the deposited rare-earth metal layer using a furnace for a rapid thermal annealing or a general furnace so that the silicon may react to the rare-earth metal. At this point, a metal layer portion that is not converted into silicide can be selectively removed. Further, the rare-earth metal silicide layer 320 can remain also on the exposed gate 230.

Figure 7:
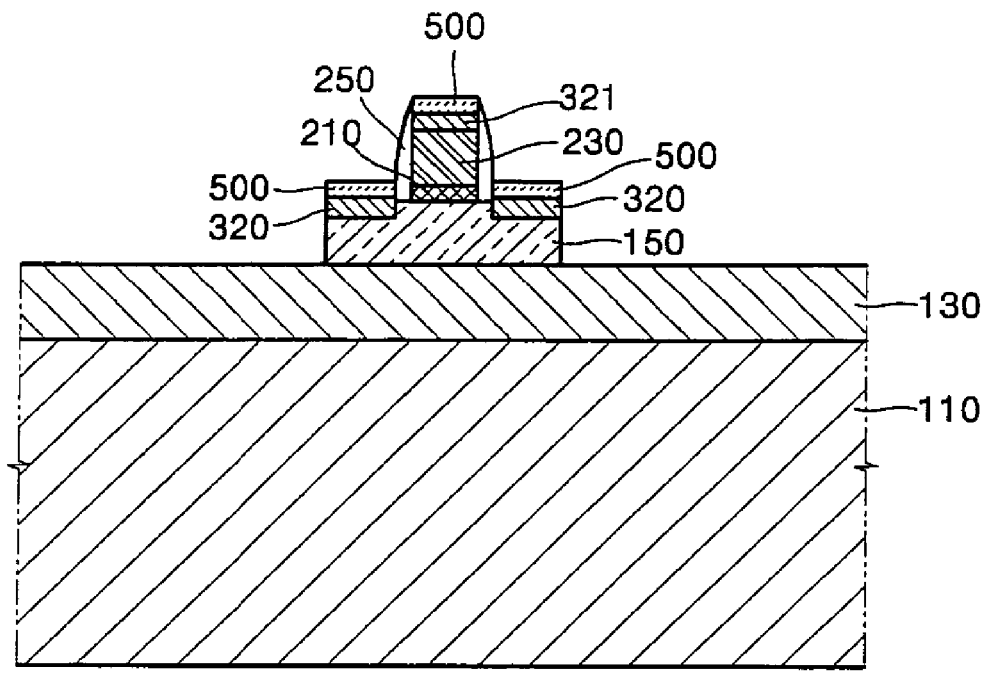

Referring to FIG. 7, the silicide forming process for forming the rare-earth metal silicide layer 320 can be performed so that the silicon is diffused out and precipitated on a surface of the rare-earth metal silicide layer 320. That is, if the thermal treatment for use in forming the silicide continues to be performed, the silicon of the source/drain is constantly diffused out and thus precipitated on the surface of the rare-earth metal silicide layer 320. Accordingly, a silicon-precipitated layer 500 can be formed on the surface of the rare-earth metal silicide layer 320.

Figure 8:
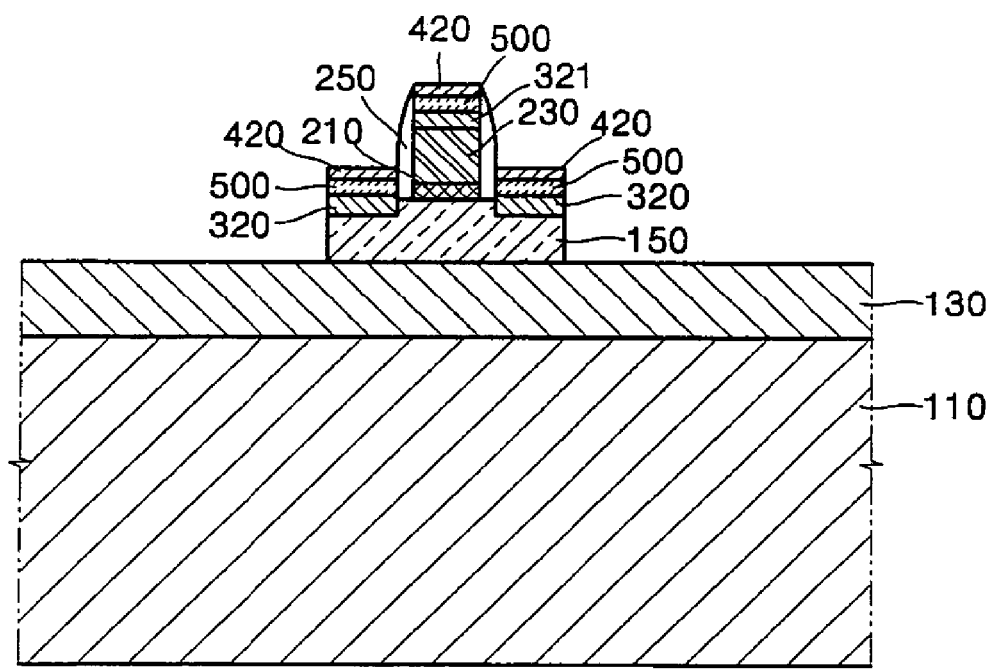

Referring to FIG. 8, a transition metal layer 420 is deposited on the silicon-precipitated layer 500. At this point, though the transition metal layer 420 exists only on the silicon-precipitated layer 500 according to FIG. 8, the transition metal layer 420 can be extended to other portions substantially.

Figure 9:
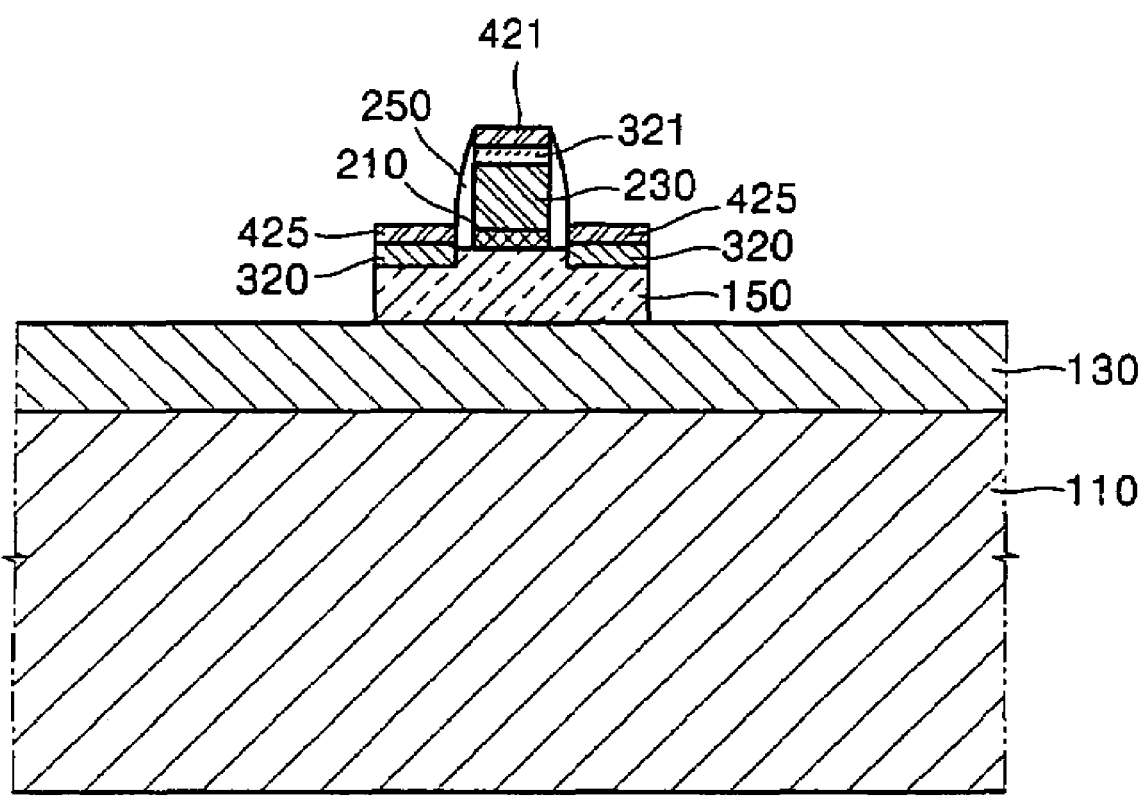

Referring to FIG. 9, after the transition metal layer 420 is deposited, the deposited transition metal layer 420 is thermally treated under a temperature lower than the formation temperature of the rare-earth metal silicide so that the deposited transition metal layer 420 may be converted into silicide. Accordingly, a transition metal silicide layer 425 is formed on the rare-earth metal silicide layer 320, whereby a silicide 320 and 425 of a two-story film structure is finally obtained on the source/drain. At this point, another silicide 321 and 421 of a two-story film structure can be formed also on the gate 230.

Further, Ni is used for a proper transition metal. Ni can react to the precipitated silicon to produce the transition metal silicide under a temperature range of about 350° C. or higher. Therefore, the thermal treatment for use in forming the transition metal silicide layer 425 can be performed under at least about 350° C. or higher.

It is possible to manufacture the SBTT of the silicide having the two-story layered structure which is suggested by the present invention using a series of the processes described with reference to the drawings.

Referring to FIG. 1, the source and the drain of the SBTT are formed in the two-story structure that includes the transition metal silicide layer 400 formed with the silicon and the transition metal on the rare-earth metal silicide layer 300 formed with the silicon and the rare-earth metal. That is, the boundary contacting the channel region of the silicon layer 150 is formed with the rare-earth metal silicide layer 300 having a small work function and the transition metal silicide layer 400 does not directly contact the channel region. At this point, the rare-earth metal silicide layer 301 and the transition metal silicide layer 401 can be additionally formed also on the gate 230 and used for a gate electrode.

According to the present invention, it is possible to increase the saturated current by forming the transition metal silicide having excellent electrical conductivity on the rare-earth metal silicide in order to reduce the parasitic resistance of the rare-earth metal silicide having a small Schottky barrier but having a large electric resistance.

The present invention can be used in realizing a multi-bit memory element.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method for manufacturing an n-type Schottky barrier tunnel transistor, comprising:
   introducing a silicon layer for a channel region;
   forming a gate overlapped on the channel region with a dielectric layer interposed on an interface of the silicon layer;

forming a rare-earth metal layer on the silicon layer beside the gate;

thermally treating the rare-earth metal layer under a first temperature to form a rare-earth metal suicide layer;

forming a transition metal layer on the rare-earth metal silicide layer; and thermally treating the transition metal layer under a second temperature lower than the first temperature to form a source/drain that includes a double layer having the rare-earth metal silicide layer and a transition metal silicide layer.

2. The method of claim 1, wherein thermally treating the rare-earth metal layer further comprises:

continuing the thermal treatment so that the silicon is diffused out and precipitated on a surface of the rare-earth metal suicide layer to form a silicon-precipitated layer.

3. The method of claim 2, wherein forming the transition metal silicide layer comprises: forming the transition metal layer on the silicon-precipitated layer; and thermally treating the transition metal layer under the second temperature that is lower than the first temperature of the thermal treatment for the rare-earth metal silicide layer so that the transition metal layer reacts to the silicon-precipitated layer to form the transition metal silicide layer.

4. The method of claim 1, further comprising:

forming a spacer on a sidewall of the gate before forming the rare-earth metal silicide layer; and having a step generated on a silicon layer portion where the source/drain is to be formed beside the spacer by performing a spacer etching.

* * * * *